(12) United States Patent
Chang

(10) Patent No.: US 9,312,378 B2
(45) Date of Patent: Apr. 12, 2016

(54) TRANSISTOR DEVICE

(71) Applicant: Semiconductor Manufacturing International Corp., Shanghai (CN)

(72) Inventor: Jianguang Chang, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 0 days.

(21) Appl. No.: 14/795,820

(22) Filed: Jul. 9, 2015

(65) Prior Publication Data
US 2015/0325671 A1 Nov. 12, 2015

Related U.S. Application Data

(62) Division of application No. 13/740,293, filed on Jan. 14, 2013, now Pat. No. 9,112,012.

(30) Foreign Application Priority Data

Aug. 21, 2012 (CN) .......................... 2012 1 0299452

(51) Int. Cl.
| | | |
|---|---|---|
| *H01L 29/78* | (2006.01) | |
| *H01L 29/66* | (2006.01) | |
| *H01L 29/423* | (2006.01) | |
| *H01L 29/49* | (2006.01) | |
| *H01L 29/792* | (2006.01) | |
| *H01L 21/28* | (2006.01) | |
| *H01L 29/51* | (2006.01) | |

(52) U.S. Cl.
CPC .......... *H01L 29/78* (2013.01); *H01L 21/28202* (2013.01); *H01L 29/42364* (2013.01); *H01L 29/4916* (2013.01); *H01L 29/513* (2013.01); *H01L 29/518* (2013.01); *H01L 29/66477* (2013.01); *H01L 29/66833* (2013.01); *H01L 29/792* (2013.01); *H01L 29/66575* (2013.01)

(58) Field of Classification Search
CPC .. H01L 21/28202; H01L 29/518; H01L 29/78
See application file for complete search history.

(56) References Cited

U.S. PATENT DOCUMENTS

| | | |
|---|---|---|
| 6,281,140 B1 | 8/2001 | Chen et al. |
| 6,670,242 B1 | 12/2003 | Brady et al. |
| 7,824,991 B2 | 11/2010 | Shih et al. |
| 2005/0199944 A1 | 9/2005 | Chen et al. |

*Primary Examiner* — Amar Movva
(74) *Attorney, Agent, or Firm* — Anova Law Group, PLLC

(57) ABSTRACT

Various embodiments provide transistors and fabrication methods. An exemplary transistor can include a silicon nitride layer disposed between a gate dielectric layer and a gate electrode layer. The silicon nitride layer can have a first surface in contact with the gate dielectric layer and a second surface in contact with the gate electrode layer. The second surface can include silicon atoms having a concentration higher than the first surface. A sidewall spacer can be formed on the semiconductor substrate along sidewalls of each of the gate electrode layer, the silicon nitride layer, and the gate dielectric layer. The disclosed transistor can have a reduced turn-on voltage with reduced power consumption.

13 Claims, 6 Drawing Sheets

TRANSISTOR DEVICE

CROSS REFERENCE TO RELATED APPLICATIONS

This application is a divisional of U.S. patent application Ser. No. 13/740,293, filed on Jan. 14, 2013, which claims priority to Chinese Patent application No. CN201210299452.5, filed on Aug. 21, 2012, the entire contents of all of which are incorporated herein by reference.

FIELD OF THE DISCLOSURE

The present disclosure relates to the field of semiconductor technology and, more particularly, relates to transistor devices and fabrication methods.

BACKGROUND

With development of semiconductor technologies, integrated circuits (ICs) move toward large scales. However, large scale integration (LSI) faces challenges including how to improve integration density of semiconductor devices and also how to reduce power consumption. It is therefore desirable for transistors, as one of the most basic semiconductor devices in ICs, to reduce their turn-on voltage and to reduce power consumption of the ICs.

FIG. 1 schematically depicts a cross-sectional view of a conventional transistor. As shown in FIG. 1, the transistor includes: a semiconductor substrate 100; a gate dielectric layer 101 made of silicon oxide and formed on the semiconductor substrate 100; a gate electrode layer 102 made of polycrystalline silicon and formed on the gate dielectric layer 101; a sidewall spacer 103 made of silicon oxide and/or silicon nitride and formed on both sides of the gate dielectric layer 101 and the gate electrode layer 102; and source/drain regions 104 formed within the semiconductor substrate 100 on both sides of the sidewall spacer 103 and the gate electrode layer 102. When the transistor is a PMOS transistor, the semiconductor substrate 100 can be doped to form an n-well therein prior to forming the gate dielectric layer 101, and the source/drain regions 104 can be implanted with p-type ions. When the transistor is an NMOS transistor, the semiconductor substrate 100 can be doped to form a p-well therein prior to forming the gate dielectric layer 101, and the source/drain regions 104 can be implanted with n-type ions.

Existing transistors require a high turn-on voltage, which in turn requires the transistors to be maintained at a high working voltage. Consequently, the ICs containing these transistors have high power consumption.

Thus, there is a need to provide a transistor with a reduced turn-on voltage and reduced power consumption, and a method of making the transistor.

BRIEF SUMMARY OF THE DISCLOSURE

According to various embodiments, there is provided a method for forming a transistor. In this method, a gate dielectric layer can be formed on a semiconductor substrate. A silicon nitride layer can be formed on the gate dielectric layer. The silicon nitride layer can include a first surface, in contact with the gate dielectric layer, and a second surface opposite to the first surface. The second surface can include silicon atoms having a concentration higher than the first surface. A gate electrode layer can be formed on the silicon nitride layer. A sidewall spacer can be formed on the semiconductor substrate and along sidewalls of each of the gate electrode layer, the silicon nitride layer, and the gate dielectric layer. A source region and a drain region can be formed in the semiconductor substrate on both sides of the gate electrode layer and the sidewall spacer.

According to various embodiments, there is also provided a transistor. The transistor can include a gate dielectric layer disposed on a semiconductor substrate; a silicon nitride layer disposed on the gate dielectric layer; a gate electrode layer disposed on the silicon nitride layer; a sidewall spacer disposed on the semiconductor substrate along sidewalls of each of the gate electrode layer, the silicon nitride layer, and the gate dielectric layer; and a source region and a drain region within the semiconductor substrate on both sides of the gate electrode layer and the sidewall spacer. The silicon nitride layer can include a first surface, in contact with the gate dielectric layer, and a second surface opposite to the first surface. The second surface can include silicon atoms having a concentration higher than the first surface.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
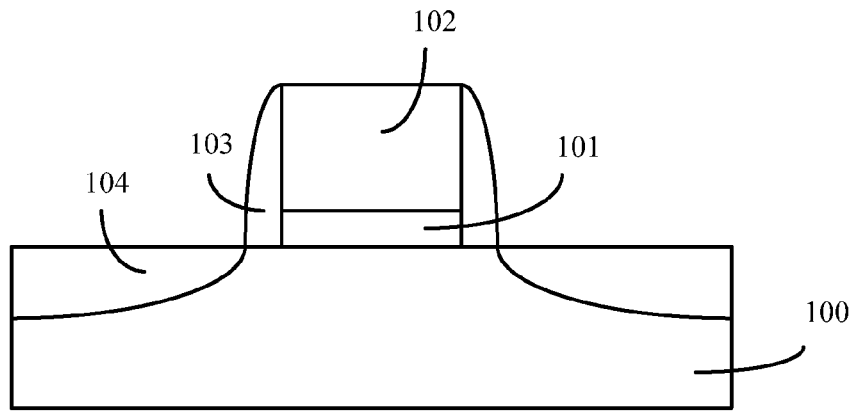
FIG. 1 is a schematic of a cross-sectional view of a conventional transistor.

A transistor having a high turn-on voltage may cause corresponding integrated circuits (ICs) to have high power consumption. A turn-on voltage of the transistor may be related to thickness of the gate dielectric layer. That is, referring to FIG. 1, the thicker the gate dielectric layer 101, the higher the turn-on voltage of the transistor. However, since the gate dielectric layer 101 is used to isolate the semiconductor substrate 100 from the gate electrode layer 102, the gate dielectric layer 101 should be made sufficiently thick to avoid generation of leakage current. The leakage current may cause unstable performance of the transistor.

As disclosed herein, a silicon nitride layer can be formed between the gate dielectric layer and the gate electrode layer. The silicon nitride layer can have a first surface in contact with the gate dielectric layer and a second surface in contact with the gate electrode layer. The second surface can have silicon atoms with a concentration (e.g., atomic percentage) higher than the first surface. When the silicon nitride layer includes silicon atoms having a high concentration, the silicon nitride layer can include charge defects to capture or give electrons. When the transistor is at ON-state, the second surface along with adjacent region(s) in the silicon nitride layer can include charge defects to capture electrons from the gate electrode layer or to give electrons to the gate electrode layer. Self-generated voltage can be produced, e.g., having the same polarity as the turn-on voltage of the transistor.

For a certain tunneling voltage required to tunnel the gate dielectric layer, the self-generated voltage can offset a portion of the turn-on voltage to provide the transistor with a reduced turn-on voltage. Further, the first surface along with adjacent region(s) in the silicon nitride layer can have nitrogen atoms with high concentration, and the second surface along with adjacent region(s) in the silicon nitride layer can have silicon atoms with high concentration. As a result, the silicon nitride layer can have a narrow band gap at the second surface and its adjacent region(s) and a wide band gap at the first surface and its adjacent region(s). This can favor electron transition within the silicon nitride layer with significant self-generated voltages.

Figure 2:
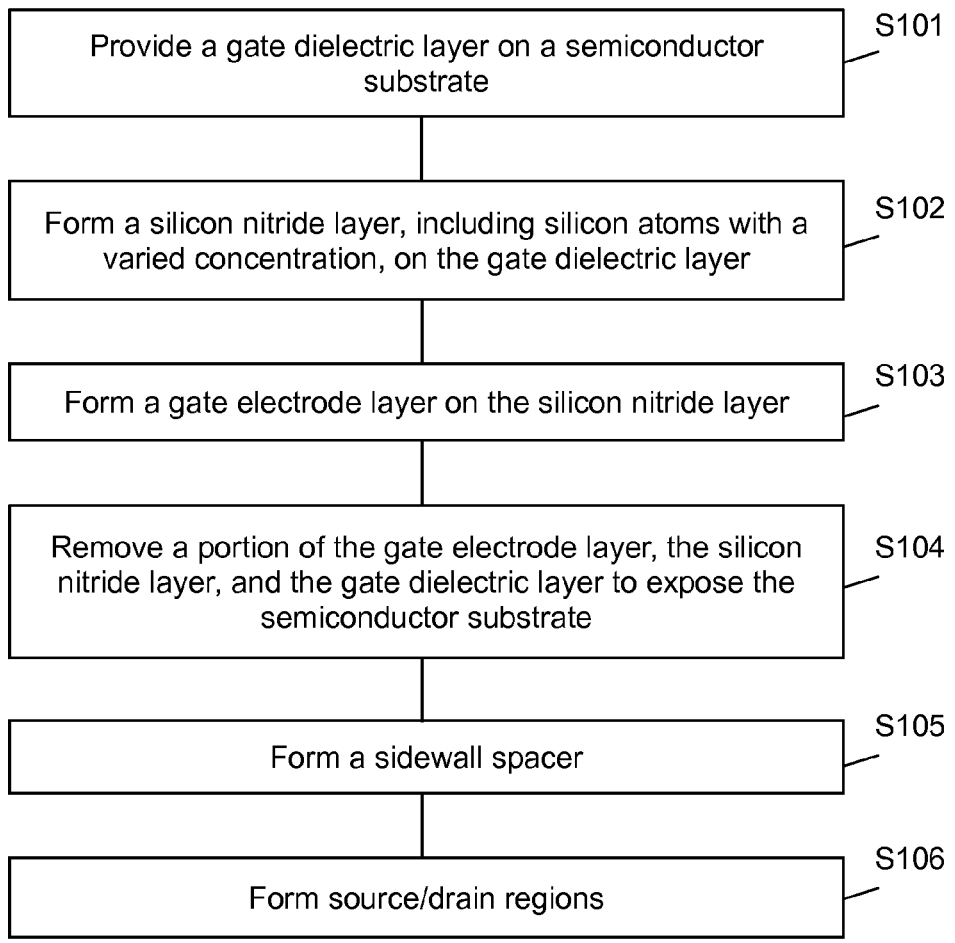
FIG. 2 is a schematic flow diagram illustrating an exemplary method for forming a transistor in accordance with various disclosed embodiments.

FIG. 2 depicts an exemplary method for forming a transistor capable of having self-generated voltage, while FIGS. 3-8 depict cross-sectional structures of the transistor at various stages during its formation as depicted in FIG. 2.

Figure 3:
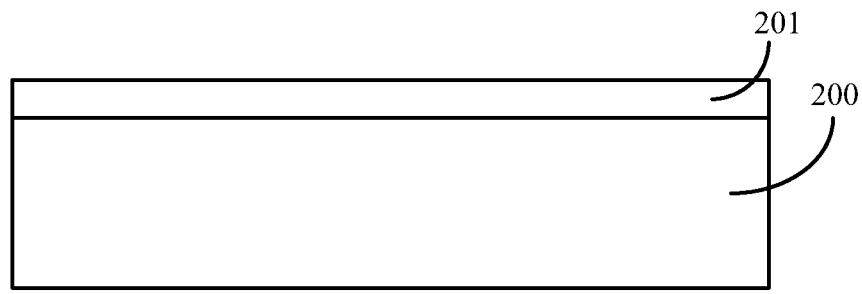
FIGS. 3-8 are schematics of cross-sectional views of an exemplary transistor at various stages during its formation in accordance with various disclosed embodiments.

At step S101 of FIG. 2 and referring to FIG. 3, there is provided a semiconductor substrate 200. A gate dielectric layer 201 can be formed on the semiconductor substrate 200.

The semiconductor substrate 200 can be used as a working platform for subsequent processes. The semiconductor substrate 200 can be made of any appropriate material including silicon, silicon germanium, silicon carbide, silicon on insulator, and/or a group III-V compound including e.g., silicon nitride, gallium arsenide, etc.

The gate dielectric layer 201 can be used to isolate the subsequently formed gate electrode layer from the semiconductor substrate 200 to prevent leakage current. Because a silicon nitride layer will be subsequently formed on the gate dielectric layer 201, the thickness of the gate dielectric layer 201 may be reduced as desired without affecting the isolation effect. In one embodiment, the thickness of the gate dielectric layer 201 can range from about 1 nm to about 10 nm, although any suitable thicknesses can be used for the gate dielectric layer 201 without limitation.

The gate dielectric layer 201 can be made of any appropriate material including, e.g., silicon oxide. The gate dielectric layer 201 can be formed by a process including, e.g., physical vapor deposition, chemical vapor deposition, and/or thermal oxidation. In one embodiment, when the semiconductor substrate is silicon, silicon germanium, silicon nitride, and/or silicon on insulator, the gate dielectric layer 201 can be formed by thermal oxidation.

Figure 4:
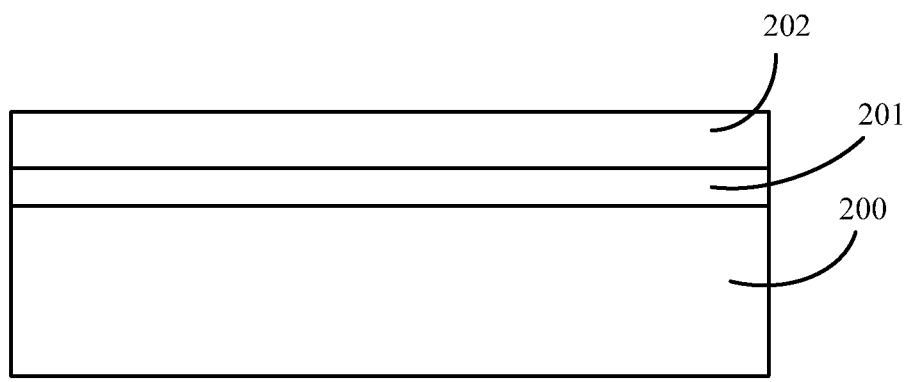

At step S102 of FIG. 2 and referring to FIG. 4, a silicon nitride layer 202 can be formed on the gate dielectric layer 201. The silicon nitride layer 202 can have a first surface in contact with the gate dielectric layer 201 and a second surface (e.g., a top surface) opposite to the first surface. The second surface can include silicon atoms having a concentration higher than the first surface.

The silicon nitride layer 202 can have a first portion (e.g., including the first surface and its adjacent region(s)) adjacent to the gate dielectric layer 201 with low concentration of silicon atoms. The silicon nitride layer 202 can have a second portion (e.g., including the second surface and its adjacent region(s)) adjacent to the subsequently formed gate electrode layer with a high concentration of silicon atoms.

When the silicon atoms in the silicon nitride layer 202 have high concentration, the silicon nitride layer 202 can carry charge defects for capturing or giving electrons. When the subsequently-formed transistor is at ON-state, i.e., when a turn-on voltage is applied between the gate electrode layer and the semiconductor substrate 200, the second portion of the silicon nitride layer 202 that is adjacent to the gate electrode with a high percentage of silicon atoms can be affected by the turn-on voltage to capture electrons from or to give electrons to the gate electrode layer.

Such electron flow can induce a self-generated current and thus a self-generated voltage in the transistor. The self-generated voltage can have the same polarity as the turn-on voltage. Therefore, for example, when the voltage required to tunnel through the gate dielectric layer 201 remains consistent, the existence of the self-generated voltage may allow a reduced turn-on voltage to be applied. Power consumption of the transistor device can be reduced.

The silicon nitride layer 202 can have a thickness, e.g., ranging from about 1 nm to about 5 nm. The silicon nitride layer 202 can be formed by a process including, e.g., chemical vapor deposition or physical vapor deposition. In one embodiment, the silicon nitride layer 202 can be formed by chemical vapor deposition including, e.g., plasma-enhanced chemical vapor deposition, low-pressure chemical vapor deposition, and/or atomic layer deposition. The silicon nitride layer 202 can have a single layer structure or a double layer structure.

In one embodiment, when the silicon nitride layer 202 has a single layer structure, the concentration of silicon atoms in the silicon nitride layer 202 can be gradually increased from the first surface, e.g., at the interface with the gate dielectric layer 201, to the second surface, e.g., at the interface with a subsequently formed gate electrode layer. The silicon nitride layer 202 may thus include a nitrogen-rich region and a silicon-rich region. The nitrogen-rich region can be in contact with the gate dielectric layer 201 and the silicon-rich region can be in contact with the subsequently formed gate electrode layer.

In various embodiments, the silicon-rich region in the silicon nitride (SiNx) layer 202 can have a ratio of atom numbers (i.e., an atom number ratio) of nitrogen atoms to silicon atoms of less than about 1.2 (e.g., x<1.2 in SiNx), and a thickness ranging from about 0.3 nm to about 1 nm. The silicon-rich region may be relatively thin to allow electrons to pass through the silicon-rich region and to migrate between the gate electrode layer and the silicon nitride layer 202. In case the silicon-rich region is overly thick, the migrating electrons may all be captured by the charge defects in the silicon-rich region. Self-generated current and voltage will not be induced and produced.

In the nitrogen-rich region of the silicon nitride layer 202, the atom number ratio of nitrogen atoms to silicon atoms can be more than about 1.2 (e.g., x>1.2 in SiNx) and the thickness of the nitrogen-rich region can be from about 1 nm to about 4 nm. The nitrogen-rich region can be in contact with the gate dielectric layer 201, and can serve as a transition between the silicon-rich region and the gate dielectric layer 201. The nitrogen-rich region and the gate dielectric layer 201 can be lattice-matched to avoid generation of leakage current and to avoid performance degradation of the transistor.

On the other hand, the band gap of the nitrogen-rich region can be large; the band gap of the silicon-rich region can be small; and the band gap of the silicon nitride layer 202 can thus be trapezoid-shaped due to the gradually varied concentration of silicon atoms between the first and the second surfaces in the silicon nitride layer 202. Accordingly, the electron transition within the silicon nitride layer 202a (e.g., in FIG. 6) can be improved, which in turn produces a self-generated current and a self-generated voltage that are high enough to facilitate reduction of the turn-on voltage of the fabricated transistor.

In one embodiment, the silicon nitride layer 202 can be formed by a deposition process including plasma-enhanced chemical vapor deposition, low-pressure chemical vapor deposition, and/or atomic layer deposition. The deposition process can include, for example, a reaction temperature ranging from about 750° C. to about 900° C.; a reactive gas including, e.g., silane gas and nitrogen; a flow rate of silane gas ranging from about 1 sccm to about 5 sccm; and/or a flow rate of nitrogen ranging from about 300 sccm to about 600 sccm.

In an embodiment when forming a single layer of the silicon nitride layer 202, the flow rate of the silane gas can be gradually increased and the flow rate of the nitrogen can be gradually decreased such that the atom number ratio of nitrogen atoms to silicon atoms in the fabricated silicon nitride layer 202 can be gradually varied from more than about 1.2 to less than about 1.2. In various embodiments, the silicon nitride layer 202 can be formed by a process determined based on specific technical requirements.

In another embodiment, the silicon nitride layer 202 can be a double layer including a nitrogen-rich layer on the gate dielectric layer 201 and a silicon-rich layer on the nitrogen-rich layer. In the nitrogen-rich layer, silicon atoms can have a consistent concentration and an atom number ratio of nitrogen atoms to silicon atoms can be more than about 1.2. The nitrogen-rich region can have a thickness, e.g., ranging from about 1 nm to about 4 nm. In the silicon-rich layer, silicon atoms can have a consistent concentration and an atom number ratio of nitrogen atoms to silicon atoms can be less than about 1.2. The silicon-rich region can have a thickness, e.g., ranging from about 0.3 nm to about 1 nm.

The nitrogen-rich layer can have a large band gap, the silicon-rich layer can have a small band gap; and the silicon nitride layer 202 can thus have a stepped band gap. When the silicon nitride layer 202 is a double layer, the silicon nitride layer 202 can be fabricated by a process that can be easily controlled.

In another embodiment, a double layer of the silicon nitride layer 202 can be formed by a deposition process including plasma-enhanced chemical vapor deposition, low-pressure chemical vapor deposition, and/or atomic layer deposition. The deposition process can include, for example, a reaction temperature ranging from about 750° C. to about 900° C.; a reactive gas including, e.g., silane gas and nitrogen; a flow rate of silane gas ranging from about 1 sccm to about 5 sccm; and/or a flow rate of nitrogen ranging from about 300 sccm to about 600 sccm.

When forming the nitrogen-rich layer, the flow rate of nitrogen can be maintained at a high value, while the flow rate of silane gas can be maintained at a low value, without adjusting the flow rates during the formation process. When forming the silicon-rich layer, the flow rate of nitrogen can be maintained at a low value, while the flow rate of silane gas can be maintained at a high value, without adjusting the flow rates during the formation process. Therefore, the formation process of the silicon nitride layer 202 can be easily controlled.

Figure 5:
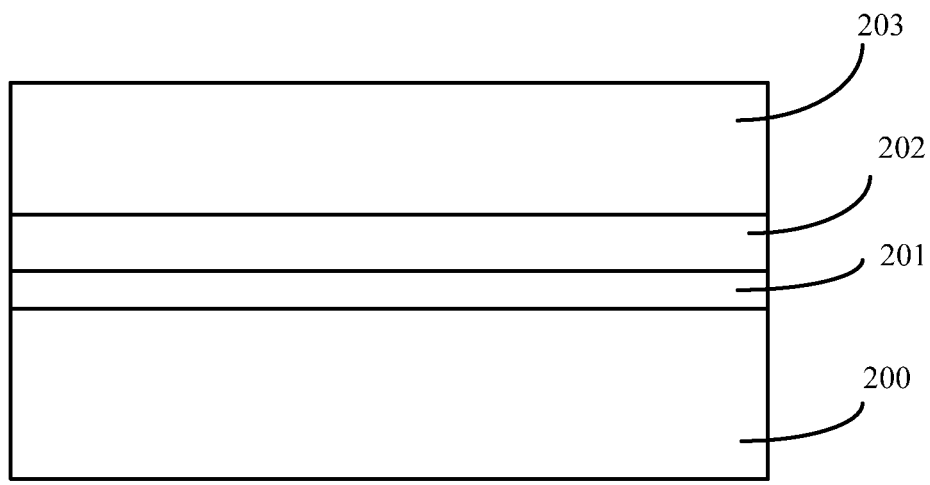

At step S103 of FIG. 2 and referring to FIG. 5, a gate electrode layer 203 can be formed on the silicon nitride layer 202. The gate electrode layer 203 can be made of a material including, e.g., polycrystalline silicon. The gate electrode layer 203 can be formed by, e.g., a deposition process, such as chemical vapor deposition.

Figure 6:
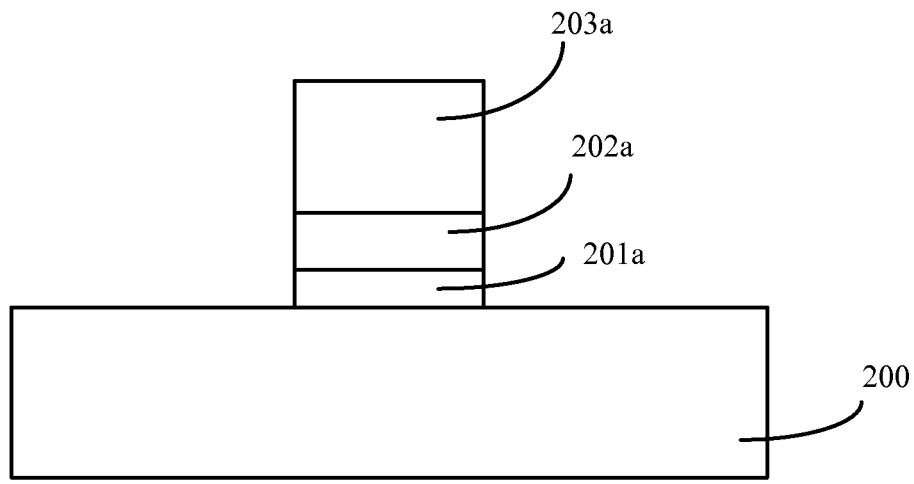

At step S104 of FIG. 2 and referring to FIG. 6, a gate electrode layer 203a, a silicon nitride layer 202a, and a gate dielectric layer 201a can be formed by etching the gate electrode layer 203, the silicon nitride layer 202, and the gate dielectric layer 201 to remove corresponding portions thereof, until surface portions of the semiconductor substrate 200 are exposed.

This etching process can include, for example, forming a photoresist layer on the gate electrode layer 203 to cover a portion corresponding to the to-be-formed gate electrode layer 203a; removing, e.g., by an etching process, the uncovered portion of each of the gate electrode layer 203, the silicon nitride layer 202, and the gate dielectric layer 201 until the semiconductor substrate 200 is exposed. The etching process can include a dry etching or a wet etching, for example, an anisotropic dry etching.

Figure 7:
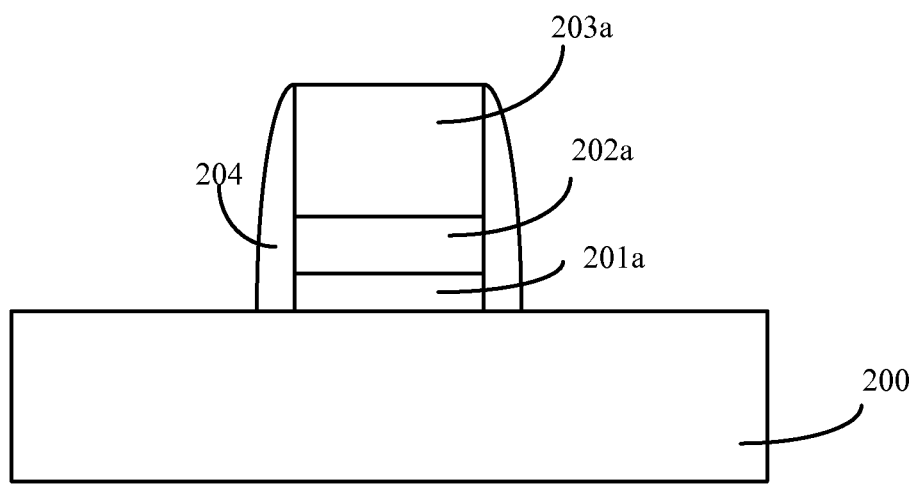

At step S105 of FIG. 2 and referring to FIG. 7, a sidewall spacer 204 can be formed on the semiconductor substrate 200 and on sidewalls of the gate electrode layer 203a, the silicon nitride layer 202a, and the gate dielectric layer 201a.

The sidewall spacer 204 can be made of a material including, e.g., silicon nitride, silicon oxide, and/or other suitable materials. The sidewall spacer 204 can be formed by a process including: forming a sidewall layer on sidewalls of the gate electrode layer 203a, the silicon nitride layer 202a, and the gate dielectric layer 201a, and on the semiconductor substrate 200; and using an etch back process to etch the sidewall layer to form the sidewall spacer 204.

Figure 8:
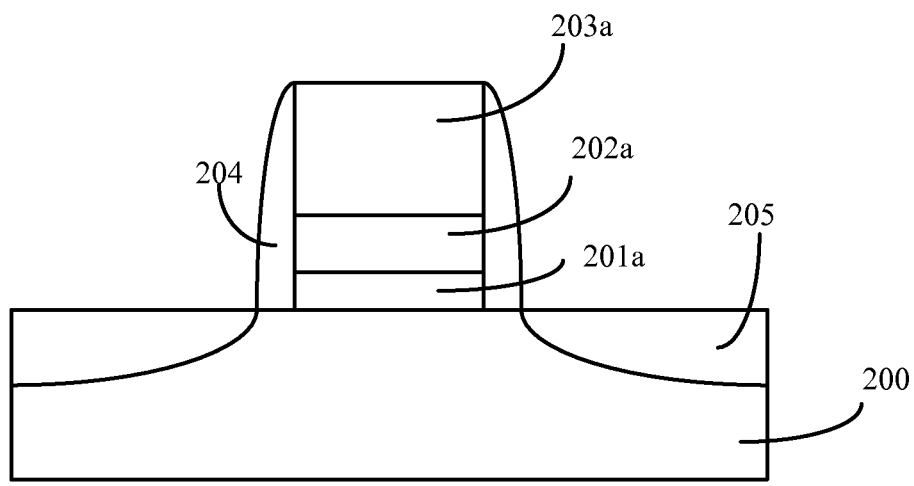

At step S106 of FIG. 2 and referring to FIG. 8, the gate electrode layer 203a and the sidewall spacer 204 can be used as a mask for ion implantation to form source/drain regions 205 in the semiconductor substrate 200 and on both sides of the gate electrode layer 203a and the sidewall spacer 204.

In one embodiment, the fabricated transistor can be a PMOS transistor. Prior to forming the gate dielectric layer 201, the semiconductor substrate 200 can be doped with n-well(s). The source/drain regions 205 can be formed by a p-type ion implantation using the gate electrode layer 203a and the sidewall spacer 204 as a mask to implant ions including, e.g., boron and indium.

In another embodiment, the fabricated transistor can be an NMOS transistor. Prior to forming the gate dielectric layer 201, the semiconductor substrate 200 can be doped with p-well(s). The source/drain regions 205 can be formed by an n-type ion implantation using the gate electrode layer 203a and the sidewall spacer 204 as a mask to implant ions including, e.g., phosphorous and arsenic.

Figure 9:
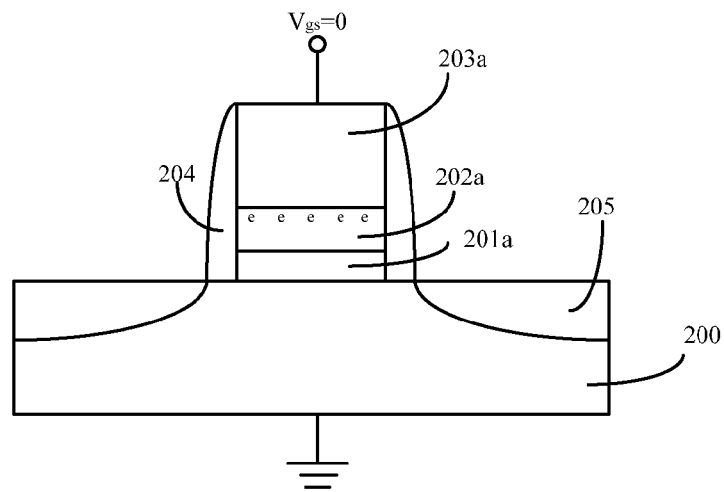
FIG. 9 is a schematic of a cross-sectional view of an exemplary NMOS transistor at an OFF-state in accordance with various disclosed embodiments.
Figure 10:
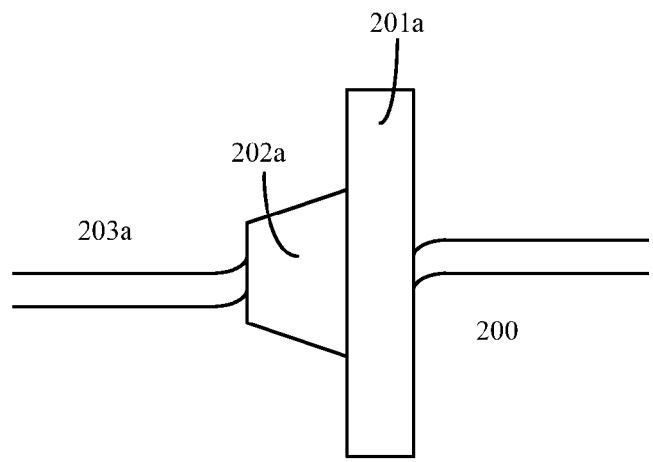
FIG. 10 is a schematic illustrating energy band of an exemplary NMOS transistor at an OFF-state in accordance with various disclosed embodiments.

FIGS. 9-16 depict exemplary transistors at an ON-state and OFF-state in accordance with various disclosed embodiments. For example, FIG. 9 is a schematic of a cross-sectional view of an exemplary NMOS transistor at an OFF-state, and FIG. 10 is a schematic of energy band of an exemplary NMOS transistor at an OFF-state in accordance with various disclosed embodiments.

When the NMOS transistor is at an OFF-state, the semiconductor substrate 200 can be grounded, while the gate electrode layer 203a can be biased by a voltage of about 0 Volt.

In one embodiment, the silicon nitride layer 202a in the NMOS transistor is a single layer, and the silicon-rich region of the silicon nitride layer 202a adjacent to the gate electrode layer 203a can include charge defects. Such charge defects can be neutral when the NMOS transistor is at the OFF-state and the charge defects can have electrons therein.

In another embodiment, the silicon nitride layer 202a is a double layer (not shown), and the silicon-rich region of the silicon nitride layer 202a adjacent to the gate electrode layer 203a can include charge defects. Such charge defects can be neutral at the OFF-state and can have electrons therein.

Referring to FIG. 10, in one embodiment, the silicon nitride layer 202a is a single layer, and silicon atoms in the silicon nitride layer 202a can have a concentration gradually increased from the first surface (e.g., in contact with the gate dielectric layer 201a) to the second surface (e.g., opposite to the first surface and in contact with the gate electrode layer 203a). The silicon-rich region in the silicon nitride layer 202a can have a band gap close to the gate electrode layer 203a. The nitrogen-rich region in the silicon nitride layer 202a can have a band gap close to the gate dielectric layer 201a. Therefore, the energy band of the silicon nitride layer 202a can be trapezoidal, i.e., with a first portion close to the gate dielectric layer 201a broader than a second portion close to the gate electrode layer 203a, as shown in FIG. 10.

In another embodiment, the silicon nitride layer 202a is a double layer (not shown), while the silicon-rich layer can have a band gap narrower than the nitrogen-rich layer and the band gaps of the silicon-rich layer or the nitrogen-rich layer can remain consistent. Therefore, the band gap of the silicon nitride layer 202a can be stepwise with the silicon-rich layer narrower than the nitrogen-rich layer.

Figure 11:
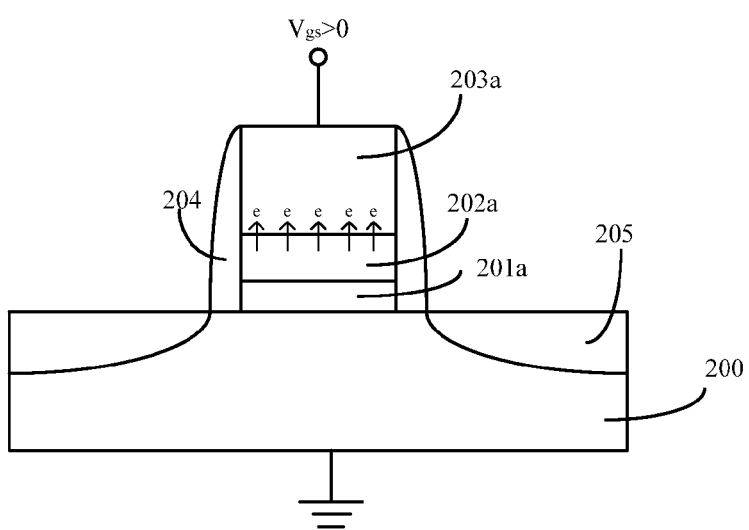
FIG. 11 is a schematic of a cross-sectional view of an exemplary NMOS transistor at an ON-state in accordance with various disclosed embodiments.
Figure 12:
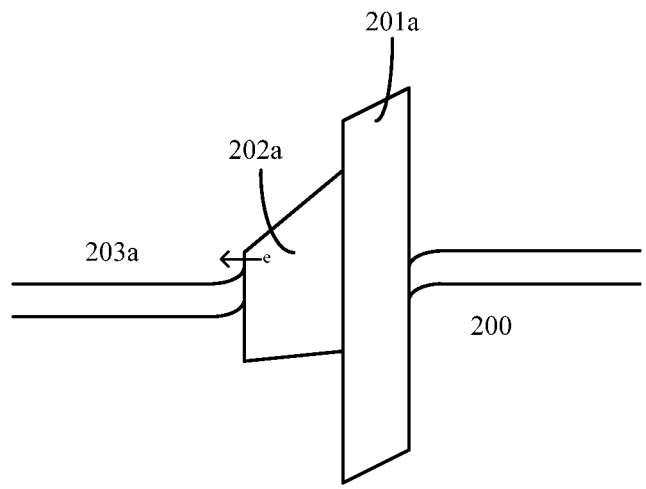
FIG. 12 is a schematic illustrating energy band of an exemplary NMOS transistor at an ON-state in accordance with various disclosed embodiments.

FIG. 11 is a schematic of a cross-sectional view of an exemplary NMOS transistor at an ON-state, and FIG. 12 is a schematic of energy band of an exemplary NMOS transistor at an ON-state in accordance with various disclosed embodiments.

When the NMOS transistor is at an ON-state, the semiconductor substrate 200 can be grounded. A positive voltage can be applied to the gate electrode layer 203a as a turn-on voltage to generate a turn-on current that flows from the gate electrode layer 203a to the semiconductor substrate 200.

In one embodiment, the silicon nitride layer 202a of the NMOS transistor is a single layer, and the silicon-rich region in the silicon nitride layer 202a adjacent to the gate electrode layer 203a can include charge defects, some of which can include electrons at the OFF-state. When the NMOS transistor is switched on, the electrons within the charge defects can be affected by the working current to be migrated from the silicon nitride layer 202a to the gate electrode layer 203a, in addition to the electron migration driven by the working current itself. Self-generated current can be produced flowing from the gate electrode layer 203a to the silicon nitride layer 202a. Accordingly, self-generated voltage can be produced. The self-generated current flows in the same direction as the turn-on current. For the gate dielectric layer 201a having a fixed thickness, the voltage required to tunnel through the gate dielectric layer 201a can be fixed. Then, the existence of the self-generated voltage allows the required turn-on voltage to be reduced, which in turn reduces the power consumption of the NMOS transistor.

Referring to FIG. 12, the working state of the NMOS transistor can be analyzed by semiconductor energy levels. When the silicon nitride layer 203a is a single layer and the NMOS transistor is at the ON-state, since electrons in the charge defects of the silicon nitride layer 202a can migrate toward the gate electrode layer 203a, the energy level of the silicon-rich region in the silicon nitride layer 202a can be reduced accordingly, and the energy required for the electric charges to transit from the energy level of the gate electrode layer 203a to the energy level of the silicon nitride layer 202a can also be reduced accordingly. In addition, because the band gap of the silicon nitride layer 202a increases gradually from the first surface to the second surface, it is easier for the electric charges to migrate within the silicon nitride layer 202a. Further, because the nitrogen-rich region and the gate dielectric layer 201a have similar energy level, it is easier for the electric charges to transit from the silicon nitride layer 202a to the gate dielectric layer 201a. Therefore, when the NMOS transistor is at ON-state, the energy required for the charge transition can be reduced and thus the required turn-on voltage can be reduced. The power consumption of the NMOS transistor can then be reduced.

In another embodiment, when the silicon nitride layer 202a of the NMOS transistor is a double layer, the working state of the NMOS transistor can be the same as for the NMOS transistor including a single layer of the silicon nitride layer 202a, as described above.

Figure 13:
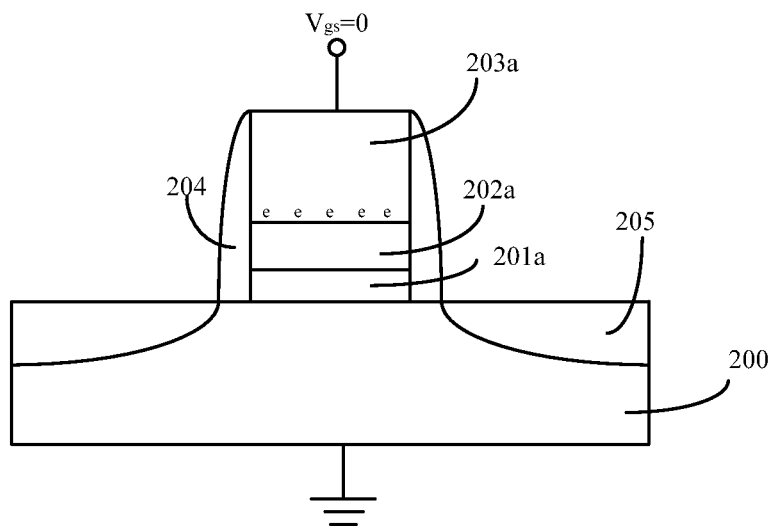
FIG. 13 is a schematic of a cross-sectional view of an exemplary PMOS transistor at an OFF-state in accordance with various disclosed embodiments.
Figure 14:
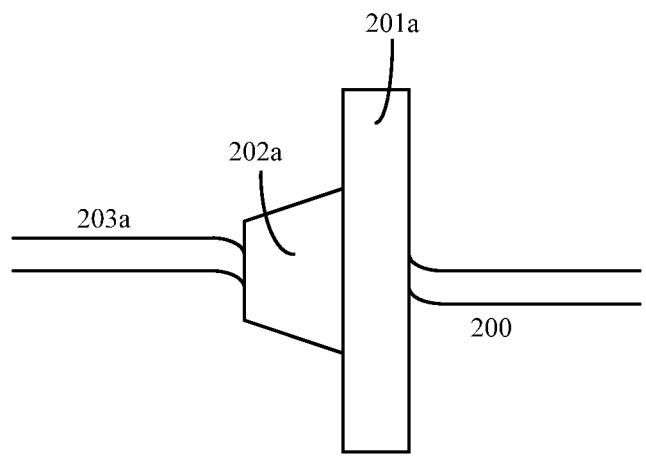
FIG. 14 is a schematic illustrating energy band of an exemplary PMOS transistor at an OFF-state in accordance with various disclosed embodiments.

FIG. 13 is a schematic of a cross-sectional view of an exemplary PMOS transistor at an OFF-state, and FIG. 14 is a schematic of energy band of an exemplary PMOS transistor at an OFF-state in accordance with various disclosed embodiments.

When the PMOS transistor is at the OFF-state, the semiconductor substrate 200 can be grounded, while the voltage applied to the gate electrode layer 203a can be about 0 Volt.

In one embodiment, the silicon nitride layer 202a of the PMOS transistor is a single layer, and the silicon-rich region adjacent to the gate electrode layer 203a can include charge defects. Such charge defects can be neutral when the PMOS transistor is at the OFF-state. The charge defects can have electrons therein.

In another embodiment, the silicon nitride layer 202a is a double layer (not shown), and the silicon-rich layer adjacent to the gate electrode layer 203a can include charge defects. Such charge defects can be neutral at the OFF-state and can have electrons therein.

Referring to FIG. 14, in various embodiments, the silicon nitride layer 202a is a single layer, and silicon atoms in the silicon nitride layer 202a can have a concentration gradually increased from the first surface to the second surface. The silicon-rich region in the silicon nitride layer 202a can have a band gap close to the gate electrode layer 203a, and the nitrogen-rich region can have a band gap close to the gate dielectric layer 201a. The silicon nitride layer 202a can have a trapezoid-shaped energy band and the portion adjacent to the gate electrode layer 203a can be narrower than the portion adjacent to the gate dielectric layer 201a.

In another embodiment, the silicon nitride layer 202a is a double layer (not shown). The silicon-rich layer in the silicon nitride layer 202a can have a band gap smaller than the nitrogen-rich layer. The band gap of the silicon-rich layer or the nitrogen-rich layer can be consistent (e.g., fixed). Therefore, the silicon nitride layer 202a can have a stepwise energy band, e.g., with the silicon-rich layer having a band gap narrower than the nitrogen-rich layer.

Figure 15:
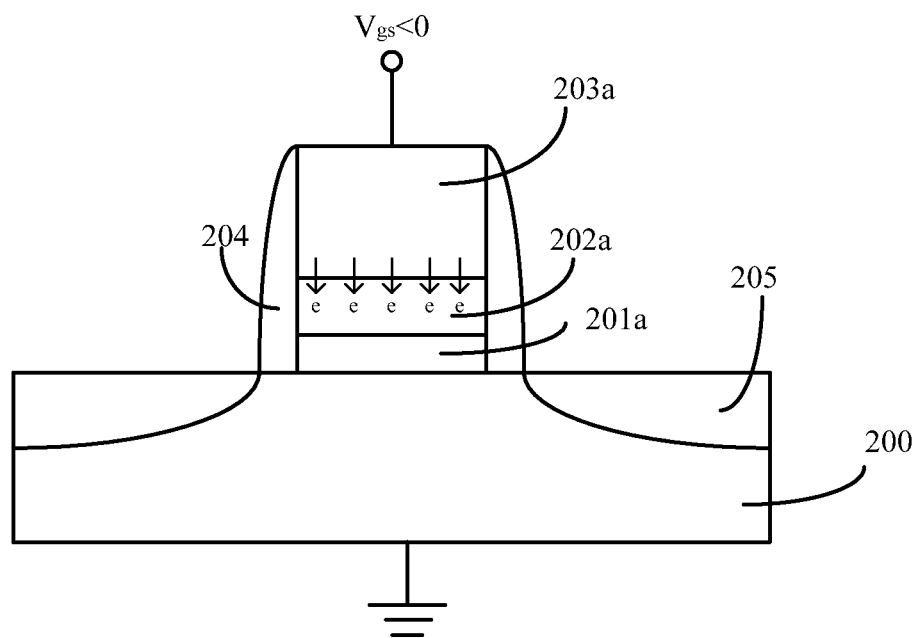
FIG. 15 is a schematic of a cross-sectional view of an exemplary PMOS transistor at an ON-state in accordance with various disclosed embodiments.
Figure 16:
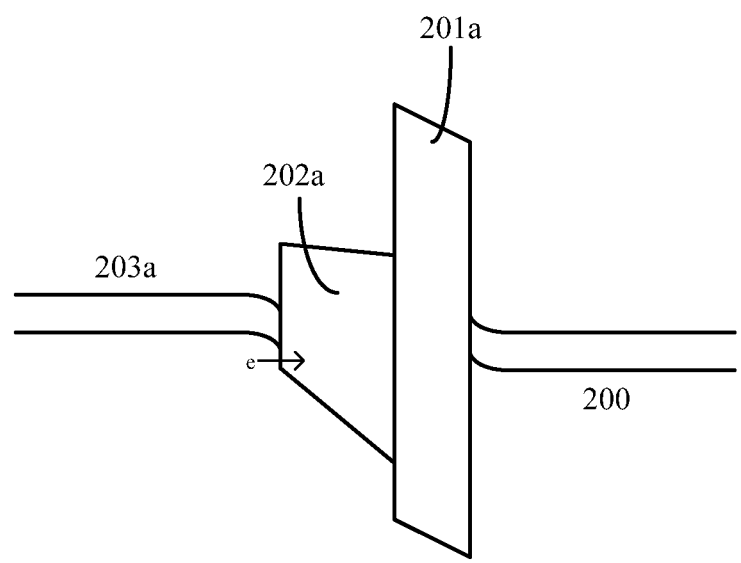
FIG. 16 is a schematic illustrating energy band of an exemplary PMOS transistor at an ON-state in accordance with various disclosed embodiments.

FIG. 15 is a schematic of a cross-sectional view of an exemplary PMOS transistor at an ON-state, and FIG. 16 is a schematic of energy band of an exemplary PMOS transistor at the ON-state in accordance with various disclosed embodiments.

When the PMOS transistor is at the ON-state, the semiconductor substrate 200 can be grounded and a negative voltage can be applied to the gate electrode layer 203a to form a turn-on voltage and to generate a turn-on current that flows from the semiconductor substrate 200 to the gate electrode layer 203a.

In one embodiment, the silicon nitride layer 202a of the PMOS transistor is a single layer, and the silicon-rich region adjacent to the gate electrode layer 203a can carry charge defects. Such charge defects can be neutral at the OFF-state. When the PMOS transistor is switched on, the charge defects can be activated to capture extra electrons from the gate electrode layer 203a, in addition to the migrating electron driven by the working current. These extra electrons can migrate from the gate electrode layer 203a to the silicon nitride layer 202a, thereby forming a self-generated current that flows from the silicon nitride layer 202a to the gate electrode layer 203a and also forming a corresponding self-generated voltage. The self-generated current can be in the same direction as the turn-on current. For the gate dielectric layer 201a having a certain (e.g., fixed) thickness, the voltage required to tunnel through the gate dielectric layer 201a can be fixed. Then, the existence of the self-generated voltage allows the required turn-on voltage to be reduced, which in turn reduces the power consumption of the PMOS transistor.

Referring to FIG. 16, the working state of the PMOS transistor can be analyzed by semiconductor energy levels. When the silicon nitride layer 203a is a single layer and the PMOS transistor is at ON-state, the charge defects of the silicon nitride layer 202a can capture extra electrons from the gate electrode layer 203a. The energy level of the silicon-rich region in the silicon nitride layer 202a can be increased and the energy required for the electric charges to transit from the energy level of the gate electrode layer 203a to the energy level of the silicon nitride layer 202a can be accordingly reduced.

In addition, since the band gap of the silicon nitride layer 202a increases gradually from the first surface to the second surface, it is easier for the electric charges to migrate within the silicon nitride layer 202a. Further, since the nitrogen-rich region has an energy level close to the gate dielectric layer 201a, it is easier for the electric charges to transit from the silicon nitride layer 202a to the gate dielectric layer 201a. Therefore, when the PMOS transistor is at ON-state, the energy required for the charge transition can be reduced, and the required turn-on voltage can be reduced accordingly. The power consumption of the PMOS transistor can be reduced.

In another embodiment, when the silicon nitride layer 202a of the PMOS transistor is a double layer, the working state of the PMOS transistor can be the same as for the PMOS transistor including a single layer of the silicon nitride layer 202a, as described above As disclosed herein, a method of forming a transistor is provided. A silicon nitride layer 202a can be formed between the gate dielectric layer 201a and the gate electrode layer 203a. The silicon nitride layer 202a can include a first surface having silicon atoms with a concentration lower than a second surface. When the silicon nitride layer 202a has a high concentration of silicon atoms, the silicon nitride layer 202a can carry charge defects to capture or give electrons. When the fabricated transistor is at the working status, the charge defects can either capture electrons from or give electrons to the gate electrode layer 203a, thereby forming a self-generated current that flows in the same direction as the working current between the gate electrode layer 203a and the silicon nitride layer 202a. A corresponding self-generated voltage can be produced. When the voltage required to tunnel through the gate dielectric layer 201a is consistent, the existence of the self-generated voltage allows the turn-on voltage of the transistor to be reduced. Power consumption of the transistor can thus be reduced. In addition, because the concentration of silicon atoms in the silicon nitride layer 202a varies and band gaps in the silicon nitride layer 202a varies, which favors the electron transition. Self-generated voltage can be produced and the turn-on voltage can be reduced. In various embodiments, the disclosed method can form a transistor with an adjustable threshold voltage.

Accordingly, a transistor can be provided according to various embodiments. Exemplary transistors are described below in conjunction with the accompanying drawings.

For example, as shown in FIG. 8, an exemplary transistor can include a semiconductor substrate 200; a gate dielectric layer 201a on the semiconductor substrate 200; a silicon nitride layer 202a on the gate dielectric layer 201a; and a gate electrode 203a on the silicon nitride layer 202a. The silicon nitride layer can have a first surface in contact with the gate dielectric layer and a second surface in contact with the gate electrode layer. The second surface can have silicon atoms with a concentration higher than the first surface. The transistor can further include a sidewall spacer 204 on the semiconductor substrate 200 and on both sidewalls of each of the gate electrode layer 203a, the silicon nitride layer 202a, and the gate dielectric layer 201a; and source/drain regions 104 in the semiconductor substrate 200 on both sides of the gate electrode layer 203a and the sidewall spacer 204.

The semiconductor substrate 200 can be used as a working platform for the subsequent fabrication processes. The semiconductor substrate 200 can be formed of a material including, e.g., silicon, silicon germanium, silicon carbide, silicon on insulator, and/or a group III-V compound including, e.g., silicon nitride, gallium arsenide, etc.

The gate dielectric layer 201a can be used to isolate the gate electrode layer 203a from the semiconductor substrate 200 to prevent leakage current. Since a silicon nitride layer 202a is disposed on the gate dielectric layer 201a, the gate dielectric layer 201a can have a reduced thickness without affecting the isolation effect. In one embodiment, the thickness of the gate dielectric layer 201a can be about 1 nm to about 10 nm. The gate dielectric layer 201a can be made of a material including, e.g., silicon oxide.

The silicon nitride layer 202a can have a thickness ranging from about 1 nm to about 5 nm without limitation. The silicon nitride layer 202 can be a single layer or a double layer.

In one embodiment where the silicon nitride layer 202a is a single layer, silicon atoms in the silicon nitride layer 202a can have a concentration gradually increased from a first surface to a second surface. The silicon nitride layer 202a can include a nitrogen-rich region and a silicon-rich region. The nitrogen-rich region can be in contact with the gate dielectric layer 201a and the silicon-rich region can be in contact with the gate electrode layer 203a. The silicon-rich region can have an atom number ratio of nitrogen atoms to silicon atoms of less than about 1.2. The silicon-rich region can have a thickness ranging from about 0.3 nm to about 1 nm.

The silicon-rich region can be relatively thin to prevent the charge defects from overly capturing electrons during the electron migration without producing self-generated current and self-generated voltage. The nitrogen-rich region can have an atom number ratio of nitrogen atoms to silicon atoms of greater than about 1.2. The nitrogen-rich region can have a thickness ranging from about 1 nm to about 4 nm. The nitrogen-rich region can be in contact with the gate dielectric layer 201a, and can serve as a transition between the silicon-rich region and the gate dielectric layer 201a. The nitrogen-rich region and the gate dielectric layer 201a can be lattice-matched to avoid a leakage current. The leakage current may degrade transistor performance.

On the other hand, the nitrogen-rich region can have a large band gap, the silicon-rich region can have a small band gap, and silicon atoms in the silicon nitride layer 202a can have a gradually varied concentration. As a result, the silicon nitride layer 202 can have a trapezoid-shaped band gap, which favors electron transition in the silicon nitride layer 202a. Large self-generated current and self-generated voltage can be produced and the turn-on voltage of the fabricated transistor can be reduced.

In another embodiment, the silicon nitride layer 202a can be a double layer including a nitrogen-rich layer on the surface of the gate dielectric layer 201a and a silicon-rich layer on the surface of the nitrogen-rich layer. The nitrogen-rich layer can have silicon atoms with a consistent concentration. The nitrogen-rich layer can have an atom number ratio of nitrogen atoms to silicon atoms greater than about 1.2. The nitrogen-rich layer can have a thickness ranging from about 1 nm to about 4 nm. The silicon-rich layer can have silicon atoms with fixed concentration. The silicon-rich layer can have an atom number ratio of nitrogen atoms to silicon atoms less than about 1.2. The silicon-rich layer can have a thickness ranging from about 0.3 nm to about 1 nm. The nitrogen-rich layer can have a large band gap and the silicon-rich layer can have a small band gap. The silicon nitride layer 202a can have a stepwise band gap.

The gate electrode layer 203a can be made of a material including, e.g., polycrystalline silicon. The sidewall spacer 204 can be made of a material including, e.g., silicon nitride and/or silicon oxide. In one embodiment, the transistor is a PMOS transistor, and the doping ions of the source/drain regions 205 can be p-type ions including, e.g., boron and indium. In another embodiment, the transistor is an NMOS transistor, and the doping ions of the source/drain regions 205 can be n-type ions including, e.g., phosphorus and arsenic.

The transistor fabricated in accordance with various disclosed embodiments can have a silicon nitride layer 202a disposed between the gate dielectric layer 201a and the gate electrode layer 203a. The silicon nitride layer 202a can have a second surface having silicon atoms with a concentration higher than a first surface. The turn-on voltage of the transistor can be significantly reduced. The power consumption of the transistor can be significantly reduced. In addition, the first surface of the silicon nitride layer 202a can have nitrogen atoms with high concentration so that the silicon nitride layer 202a and gate dielectric layer 201a can be lattice-matched to reduce the leakage current.

Other applications, advantages, alternations, modifications, or equivalents to various disclosed embodiments are obvious to those skilled in the art.

What is claimed is:

1. A transistor comprising:
a semiconductor substrate;
a gate dielectric layer disposed on the semiconductor substrate;
a silicon nitride layer, disposed on the gate dielectric layer and including a double layer structure including a nitrogen-rich layer on the gate dielectric layer and a silicon-rich layer on the nitrogen-rich layer, such that the double layer structure includes a stepped band gap provided by the silicon-rich layer having a band gap and the nitrogen-rich layer having a different band gap,
wherein an atom number ratio of nitrogen atoms to silicon atoms in the nitrogen-rich layer is greater than about 1.2, and the nitrogen-rich layer has a thickness ranging from about 1 nm to about 4 nm;
a gate electrode layer disposed on the silicon nitride layer, wherein the silicon nitride layer includes a first surface in contact with the gate dielectric layer and a second surface opposite to the first surface, the second surface including silicon atoms having a concentration higher than the first surface;
a sidewall spacer disposed on the semiconductor substrate and along sidewalls of each of the gate electrode layer, the silicon nitride layer, and the gate dielectric layer; and
a source region and a drain region within the semiconductor substrate on both sides of the gate electrode layer and the sidewall spacer.

2. The transistor of claim 1, wherein the concentration of silicon atoms is gradually increased from the first surface to the second surface of the silicon nitride layer.

3. The transistor of claim 2, wherein the silicon nitride layer includes a nitrogen-rich region and a silicon-rich region, the nitrogen-rich region corresponds to the nitrogen-rich layer and is in contact with the gate dielectric layer, and the silicon-rich region corresponds to the silicon-rich layer and is in contact with the gate electrode layer.

4. The transistor of claim 3, wherein an atom number ratio of nitrogen atoms to silicon atoms in the silicon-rich region is less than about 1.2, and the silicon-rich region has a thickness ranging from about 0.3 nm to about 1 nm.

5. The transistor of claim 1, wherein the silicon nitride layer has a thickness ranging from about 1 nm to about 5 nm.

6. The transistor of claim 1, wherein the gate dielectric layer is made of a material including silicon oxide, the gate electrode layer is made of a material including polycrystalline silicon, and the sidewall spacer is made of a material including silicon nitride, silicon oxide, or a combination thereof.

7. The transistor of claim 1, wherein the nitrogen-rich layer and the silicon-rich layer are formed by a deposition process including plasma-enhanced chemical vapor deposition, low-pressure chemical vapor deposition, or atomic layer deposition with ease control of each layer.

8. A transistor, comprising:
a semiconductor substrate;
a gate dielectric layer disposed on the semiconductor substrate;
a silicon nitride layer, disposed on the gate dielectric layer and including a double layer structure including a nitrogen-rich layer on the gate dielectric layer and a silicon-rich layer on the nitrogen-rich layer, such that the double layer structure includes a stepped band gap provided by the silicon-rich layer having a band gap and the nitrogen-rich layer having a different band gap, and
wherein an atom number ratio of nitrogen atoms to silicon atoms in the silicon-rich layer is less than about 1.2, and the silicon-rich layer has a thickness ranging from about 0.3 nm to about 1 nm;
a gate electrode layer disposed on the silicon nitride layer, wherein the silicon nitride layer includes a first surface in contact with the gate dielectric layer and a second surface opposite to the first surface, the second surface including silicon atoms having a concentration higher than the first surface;

a sidewall spacer disposed on the semiconductor substrate and along sidewalls of each of the gate electrode layer, the silicon nitride layer, and the gate dielectric layer; and a source region and a drain region within the semiconductor substrate on both sides of the gate electrode layer and the sidewall spacer.

9. The transistor of claim 8, wherein the concentration of silicon atoms is gradually increased from the first surface to the second surface of the silicon nitride layer.

10. The transistor of claim 8, wherein an atom number ratio of nitrogen atoms to silicon atoms in the nitrogen-rich layer is greater than about 1.2, and the nitrogen-rich region has a thickness ranging from about 1 nm to about 4 nm.

11. The transistor of claim 8, wherein the nitrogen-rich layer and the silicon-rich layer are formed by a deposition process including plasma-enhanced chemical vapor deposition, low-pressure chemical vapor deposition, or atomic layer deposition with ease control of each layer.

12. The transistor of claim 8, wherein the silicon nitride layer has a thickness ranging from about 1 nm to about 5 nm.

13. The transistor of claim 8, wherein the gate dielectric layer is made of a material including silicon oxide, the gate electrode layer is made of a material including polycrystalline silicon, and the sidewall spacer is made of a material including silicon nitride, silicon oxide, or a combination thereof.

* * * * *